(12) United States Patent
Jedwab et al.

(10) Patent No.: US 7,472,330 B2
(45) Date of Patent: Dec. 30, 2008

(54) MAGNETIC MEMORY WHICH COMPARES COMPRESSED FAULT MAPS

(75) Inventors: Jonathan Jedwab, Vancouver (CA); David Murray Banks, Bristol (GB)

(73) Assignee: Samsung Electronics Co., Ltd. (KR)

( * ) Notice: Subject to any disclaimer, the term of this patent is extended or adjusted under 35 U.S.C. 154(b) by 555 days.

(21) Appl. No.: 10/722,918

(22) Filed: Nov. 26, 2003

(65) Prior Publication Data

US 2005/0138495 A1 Jun. 23, 2005

(51) Int. Cl.
*G11C 29/00* (2006.01)

(52) U.S. Cl. ..................... 714/763
(58) Field of Classification Search .............. 614/360, 614/736–745; 365/48, 50, 55, 74, 80, 97, 365/131; 714/710, 763, 721
See application file for complete search history.

(56) References Cited

U.S. PATENT DOCUMENTS

| | | | |
|---|---|---|---|
| 4,363,125 A | 12/1982 | Brewer et al. | |
| 4,456,995 A * | 6/1984 | Ryan | 714/723 |
| 5,233,614 A * | 8/1993 | Singh | 714/723 |
| 5,317,573 A * | 5/1994 | Bula et al. | 714/711 |
| 5,383,204 A | 1/1995 | Gibbs et al. | |
| 5,448,577 A | 9/1995 | Wells et al. | |
| 5,629,949 A | 5/1997 | Zook | |
| 5,671,237 A | 9/1997 | Zook | |
| 5,724,368 A | 3/1998 | Zook | |
| 5,917,841 A | 6/1999 | Kodama et al. | |
| 6,115,837 A | 9/2000 | Nguyen et al. | |
| 6,191,614 B1 | 2/2001 | Schultz et al. | |
| 6,301,680 B1 | 10/2001 | Cypher | |
| 6,304,992 B1 | 10/2001 | Cypher | |
| 6,311,299 B1 * | 10/2001 | Bunker | 714/719 |
| 6,360,340 B1 * | 3/2002 | Brown et al. | 714/718 |
| 6,373,758 B1 * | 4/2002 | Hughes et al. | 365/200 |
| 6,374,378 B1 * | 4/2002 | Takano et al. | 714/719 |
| 6,381,710 B1 * | 4/2002 | Kim | 714/45 |
| 6,634,004 B1 * | 10/2003 | Yamada et al. | 714/721 |
| 6,721,911 B1 * | 4/2004 | Marinissen et al. | 714/718 |
| 6,728,138 B2 * | 4/2004 | Katayama et al. | 365/185.09 |
| 6,839,275 B2 * | 1/2005 | Van Brocklin et al. | 365/173 |
| 6,842,874 B1 * | 1/2005 | Voshell | 714/723 |
| 2001/0037482 A1 | 11/2001 | Plants | |
| 2002/0031017 A1 * | 3/2002 | Yumoto | 365/200 |
| 2003/0023922 A1 * | 1/2003 | Davis et al. | 714/763 |
| 2003/0023923 A1 | 1/2003 | Davis | |
| 2006/0242492 A1 * | 10/2006 | Hoffmann et al. | 714/718 |

FOREIGN PATENT DOCUMENTS

| | | |
|---|---|---|
| EP | 1132924 A2 | 10/2000 |
| EP | 1 132 924 A2 | 9/2001 |

* cited by examiner

*Primary Examiner*—M. Mujtaba K Chaudry
*Assistant Examiner*—Sam Rizk
(74) *Attorney, Agent, or Firm*—Myers Bigel Sibley & Sajovec (57) ABSTRACT

A magnetic memory which in some embodiments compares compressed fault maps is disclosed. In one embodiment, the magnetic memory may include at least two magnetic memory cells which are configured to store data. The magnetic memory includes a control system configured to periodically obtain parametric values from the magnetic memory cells and generate a corresponding compressed fault map using the parametric values. In some embodiments, at least one of the compressed fault maps is compared to a previous one of the compressed fault maps, and an indication is provided if there are differences.

35 Claims, 6 Drawing Sheets

*(BACKGROUND ART)*

Fig. 4

*(BACKGROUND ART)*

Fig. 5

| UNSORTED FAULT MAP: | 01 02 09 03 02 0c 00 de<br>00 11 0b 03 00 dd 00 11<br>00 0c 07 02 00 63 03 e9<br>01 02 09 01 02 64 01 b0 |
|---|---|
| SORTED FAULT MAP: | 00 0c 07 02 00 63 03 e9<br>00 11 0b 03 00 dd 00 11<br>01 02 09 01 02 64 01 b0<br>01 02 09 03 02 0c 00 de |
| FAULT MAP SIGNATURE: | 7358fb22 |

Fig. 6

Fig. 7 ated cells. A cells which lie in the same row or column.

MAGNETIC MEMORY WHICH COMPARES COMPRESSED FAULT MAPS

BACKGROUND OF THE INVENTION

Failures can occur in integrated circuit memory storage devices which affect their ability to store data reliably. The failures frequently occur in the memory cells of the memory storage devices and can result from many causes. These causes include manufacturing imperfections, operating conditions such as voltage supply degradation, and environmental conditions such as temperature variation outside a specified range. The failures can also result from a variety of well known failure mechanisms such as oxide time dependent dielectric breakdown or metal electromigration. The failures can be classified as either systematic failures or random failures. Systematic failures consistently affect a particular memory storage cell, or a particular group of memory storage cells. Random failures occur transiently and are not consistently repeatable.

Systematic and random failures or faults are undesirable in memory storage devices because the memory storage cells cannot be written to or read from reliably. A memory cell affected by a fault can become unreadable, resulting in an inability to read a logic value from the memory cell. A memory cell affected by a fault can also become unreliable so that the logic value stored in the cell is not necessarily the logic value read. Once a memory cell having a fault is identified, information about the memory cell can be retained or cataloged so that the memory cell is no longer used.

One approach used to catalog memory cells having faults is to store addresses of the affected cells so that data can no longer be written to or read from the cells. Storing information about the affected memory cells, however, can be inefficient due to the potentially large number of affected cells. A single physical failure, such as a shorted bit failure, can affect a large number of memory cells which lie in the same row or column.

Another approach used to catalog memory cells having faults is to count the number of faults which are detected. With this approach, if a later count of the number of faults in the memory storage device matches an earlier count of the number of faults, the previously valid data units are assumed to still be valid, and data can be stored in those data units while skipping the data units containing errors.

One problem of using counts is that if the location of a fault were to change, this would go undetected because the total number of counts would remain unchanged. To reduce the potential of this occurring, separate counts can be maintained for each data unit, such as for each sector or byte. However, even with this approach, if the location of a fault were to change in the sector or byte, this would still go undetected because the total number of faults in the sector or byte would remain unchanged.

SUMMARY OF THE INVENTION

The present invention provides a magnetic memory which compares compressed fault maps. One embodiment of the present invention provides a magnetic memory which includes at least two magnetic memory cells which are configured to store data. The magnetic memory includes a control system configured to periodically obtain parametric values from the magnetic memory cells and generate a corresponding compressed fault map using the parametric values. At least one of the compressed fault maps is compared to a previous one of the compressed fault maps, and an indication is provided if there are differences.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
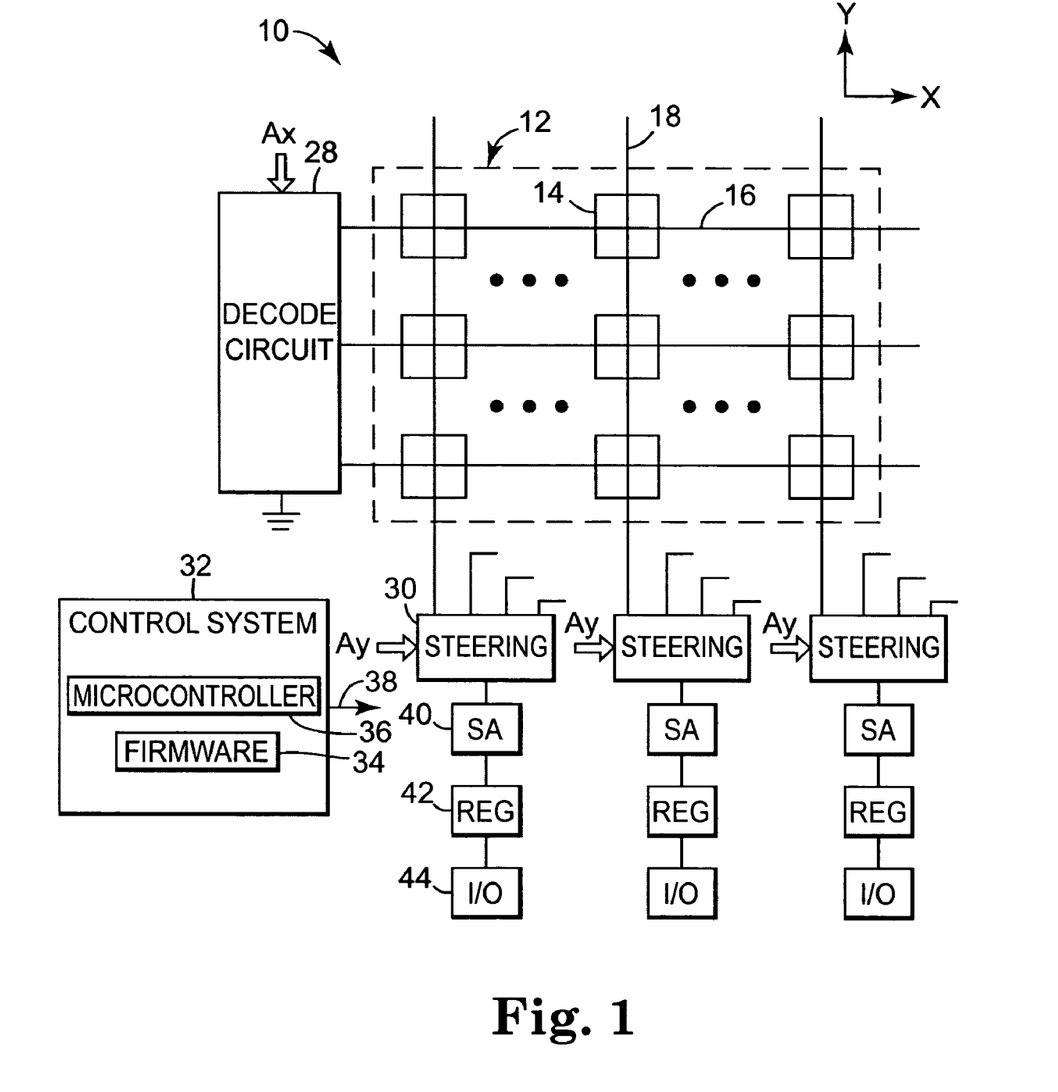
FIG. 1 is a diagram illustrating an exemplary embodiment of a magnetic memory according to the present invention.

FIG. 1 is a diagram illustrating an exemplary embodiment of a magnetic memory 10 according to the present invention. The magnetic memory 10 includes an array 12 of magnetic memory cells 14 which are arranged in rows and columns, with the rows extending along an x-direction and the columns extending along a y-direction. Only a relatively small number of magnetic memory cells 14 are shown to simplify the description of the invention. In other embodiments, the array 12 is any suitable size. In other embodiments, the array 12 can utilize highly parallel modes of operation, such as 64-bit wide or 128-bit wide operation.

In one embodiment, word lines 16 extend along the x-direction in a plane on one side of array 12 and bit lines 18 extend along the y-direction in a plane on an adjacent side of array 12. In one embodiment, there is one word line 16 for each row of array 12 and one bit line 18 for each column of array 12. In the embodiment illustrated in FIG. 1, each magnetic memory cell 14 is located at an intersection or cross point of a word line 16 and a bit line 18.

In one embodiment, array 12 includes a 1024 by 1024 arrangement of magnetic memory cells 14. In one embodiment, one row 16 and one or more columns 18 are selected to access the desired magnetic memory cells 14. In one embodiment, with a different orientation of array 12, one column 18 and one or more rows 16 are selected to access the desired magnetic memory cells 14.

During a read operation for a slice read, a single row 16 and several column lines 18 are accessed and data is read from the intersected magnetic memory cells 14. In one embodiment, the single row 16 intersects 1024 magnetic memory cells 14. The accessed magnetic memory cells 14 are separated by a minimum reading distance such as 64 magnetic memory cells in order to minimize cross-cell interference during the read operation. Each slice provides up to 1024/64=16 bits from the accessed array 12. In other embodiments, any suitable number of independently addressable arrays 12 can be arranged to form a macro array (see also, FIG. 5).

The magnetic memory cells 14 are not limited to any particular type of device. Magnetic memory cells 14 may be, for example, spin dependent tunneling junction devices, anisotropic magnetoresistance devices, giant magnetoresistance devices, colossal magnetoresistance devices, extraordinary magnetoresistance devices or very large magnetoresistance devices.

In the exemplary embodiment, magnetic memory 10 includes a row decode circuit 28, steering circuits 30 and a control system 32. Decode circuit 28 and steering circuits 30 select word lines 16 and bit lines 18 during read and write operations. During write operations, control system 32 controls a write circuit which sets the orientation of the magnetization of selected memory cells 14 (see also, FIGS. 2A, 2B and 3). The write circuit is not shown in order to simplify the explanation of the invention. In various embodiments, control system 32 can be on the same substrate as array 12, or can be separate from array 12, such as on a separate substrate, or can be in other components used to communicate with magnetic memory 10 or array 12.

Sense amplifiers 40 sense the resistance of selected memory cells 14 during read operations. A memory cell 14 is selected by supplying a row address Ax to the decode circuit 28 and a column address Ay to steering circuits 30. In response to the row address Ax, the decode circuit 28 couples one end of a selected word line 16 to ground. In response to the column address Ay, a steering circuit 30 couples a bit line 18 to a sense amplifier 40. A selected memory cell 14 lies at the cross point of the selected word and bit lines 16 and 18.

In the exemplary embodiment, each steering circuit 30 includes a set of switches that connect each bit line 18 to either a constant voltage source or to a sense amplifier 40. Each steering circuit 30 further includes a column decoder which is not shown in order to simplify the explanation of the invention. The column decoder selects only one switch for connecting the selected bit line 18 to the sense amplifier 40. All other unselected bit lines 18 are connected to a constant voltage source.

In the exemplary embodiment, control system 32 is configured to periodically obtain parametric values from the magnetic memory cells 14 and generate a corresponding compressed fault map using the parametric values. In the exemplary embodiments, at least one of the compressed fault maps is compared to a previous compressed fault map and an indication is provided at 38 if there are differences.

In various embodiments, control system 32 is configured to periodically obtain the parametric values from any suitable number of magnetic memory cells 14 in magnetic memory 10, or from any suitable number of magnetic memory cells 14 which are included in at least one array 12 within magnetic memory 10. In other embodiments, control system 32 can periodically obtain parametric values from any suitable number or configurations of magnetic memory 10, or from any suitable number or configurations of array 12.

In the exemplary embodiment, control system 32 periodically obtains the parametric values using any suitable time increment. In one embodiment, control system 32 counts a predetermined number of clock cycles which are generated by a system clock used to control magnetic memory 10. In one embodiment, sensors located on or off magnetic memory 10 monitor ambient temperature or the voltage level of the power supply used to supply voltage to magnetic memory 10. Control system 32 provides the indication at 38 when the voltage or temperature thresholds are exceeded. In other embodiments, any suitable event can be used to signal control system 32 to obtain the parametric values.

In the exemplary embodiment, control system 32 includes firmware illustrated at 34 which is configured to store a procedure for obtaining parametric values from magnetic memory cells 14 in the array 12 and for generating a compressed fault map using the parametric values. In other embodiments, the procedure can be stored using any suitable storage device or approach. A microcontroller illustrated at 36 is included and is configured to execute the procedure stored in firmware 34.

In one embodiment, microcontroller 36 executes the procedure stored in firmware 34 a first time to generate a first compressed fault map. Microcontroller 36 executes the procedure at one or more time intervals after the first time and compares a second compressed fault map generated at each time interval to the first compressed fault map and provides an indication at 38 if there are differences between the second compressed fault map and the first compressed fault map.

In the exemplary embodiment, the procedure or test procedure is executed at a suitable time to generate a first fault map which is stored in a compressed form. The first compressed fault map or previous compressed fault map is used to compare to a later generated compressed fault map, and is stored in one or more magnetic memory cells located on one or more arrays, or within one or more magnetic memories 10. In various embodiments, the first compressed fault map or previous compressed fault map can be generated more than once to compare to a later generated compressed fault map.

In the exemplary embodiment, the test procedure stored in firmware 34 is executed by microcontroller 36 to generate a second compressed fault map. In various embodiments, the test procedure can be executed by microcontroller 36 at suitable times or on a suitable periodic basis. In the exemplary embodiment, the second compressed fault map is compared to the first compressed fault map or previous compressed fault map. In various embodiments, the comparison can be performed on a bit by bit basis or any other suitable basis to determine if there are differences between the second compressed fault map and the first compressed fault map or previous compressed fault map. The test procedure for each group of memory cells can be performed two or more times, and if there is a discrepancy indicating a random failure, testing continues until there is a preponderance of evidence for the correct value.

In the exemplary embodiment, if there are differences between the compressed fault maps, one or more memory cells 14 have a fault. The fault indicates that the magnetic memory cells 14 could lose their stored data, or that memory cells 14 have already lost their stored data. The indication of the differences is provided at 38. In one embodiment, the indication is a data error flag which can be used to notify a user of the error. In one embodiment, the indication at 38 is used to initiate the migration of data, from one or more magnetic memories 10 or arrays 12 in which one or more faults have occurred, to other media. In various embodiments, the data can be migrated or transferred to any suitable magnetic memory cells 14 which are within the same array 12 in which the faults have occurred, within another array 12, or within another magnetic memory 10.

Figure 6:
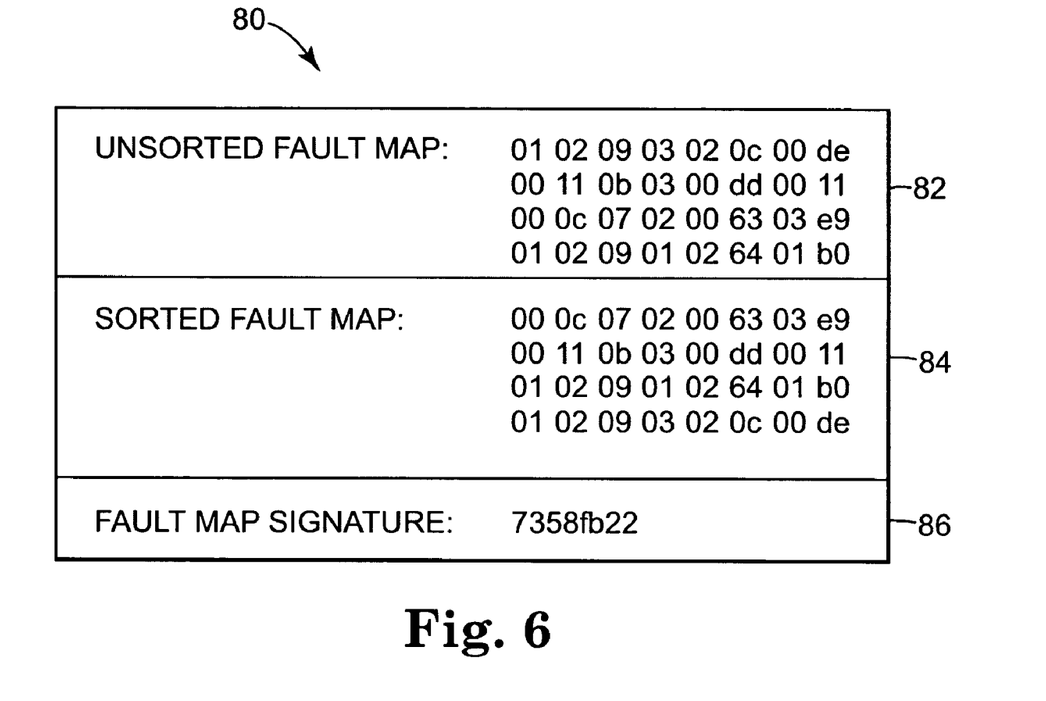
FIG. 6 is a diagram illustrating an exemplary embodiment of an unsorted fault map, a sorted fault map and a fault map signature.

In the exemplary embodiment, each compressed fault map includes at least one error detection code result (see also, FIG. 6). The error detection code result is calculated using a cyclic redundancy check code. In the exemplary embodiment, each error detection code result is compared to a previous error detection code result, and the indication at 38 is provided if there are differences.

In one embodiment, each one of the compressed fault maps includes at least one error detection code result. The error detection code result is calculated over the addresses of the magnetic memory cells 14 which have a fault. Each one of the magnetic memory cells 14 has a corresponding one of at least two addresses. The magnetic memory cells 14 have a fault when a corresponding one of the parametric values is not within an expected range (see also, FIG. 4).

In one embodiment, each one of the compressed fault maps includes at least two error detection code results. Each one of the error detection code results is calculated for a corresponding one of at least two address ranges and over the addresses of the magnetic memory cells 14 which have the fault and are within a same one of the address ranges. Each one of the addresses is within only one of the address ranges.

In various embodiments, the address range can include any suitable range of addresses which includes one or more magnetic memory cells 14 in any suitable logic configuration or organization of data units (e.g. bytes or sectors). In one embodiment, each address range includes a slice which includes 16 bits from the array 12. In one embodiment, each address range includes two or more slices from the array 12. In other embodiments, the address range can include a sector which includes any suitable number of bytes of data, such as 512 bytes. In one embodiment, each address range includes one or more arrays 12 of magnetic memory cells 14. The arrays 12 can each include, in various embodiments, any suitable number of magnetic memory cells 14, such as a 1024 by 1024 array of magnetic memory cells 14. In one embodiment, each address range includes one or more magnetic memories 10. In other embodiments, each address range includes any suitable number, organization or configuration of magnetic memory cells 14, arrays 12 or magnetic memories 10.

In one embodiment, each one of the compressed fault maps includes at least one error detection code result. The error detection code result is calculated over the fault types and corresponding addresses of the magnetic memory cells 14 which have a fault. Each magnetic memory cell 14 has a corresponding address and the corresponding parametric value is compared to an expected range to infer a corresponding fault type.

In the exemplary embodiment, the previous compressed fault map is stored in at least one of the magnetic memory cells 14. In various embodiments, the compressed fault maps or previous fault maps can be stored in any suitable magnetic memory cells 14 at any suitable address locations, either within one or more arrays 12, or within one or more magnetic memories 10.

In one embodiment, each one of the compressed fault maps includes at least two error detection code results. Each one of the error detection code results is calculated over one of the fault types and the corresponding addresses of all of the magnetic memory cells 14 which have a same one of the fault types.

In one embodiment, each one of the compressed fault maps includes at least two error detection code results. Each one of the error detection code results is calculated for a corresponding one of at least two address ranges. The error detection code results are calculated over the fault types and the corresponding addresses of the magnetic memory cells 14 which have the fault and are within a same one of the address ranges. Each one of the addresses is within only one of the address ranges.

In one embodiment, each one of the compressed fault maps includes at least one hash function result. In various embodiments, the hash function can be calculated over faults, fault types, addresses or address ranges, or any combination thereof. In one embodiment, the hash function is an MD5 (i.e., message algorithm). The MD5 algorithm produces a 128-bit hash from a suitably sized block of data which is stored in the magnetic memory cells 14. In one embodiment, the hash function is a secure hash algorithm (SHA). The SHA algorithm is similar to the MD5 algorithm in that it does various bit shuffling to process the input data in blocks. The SHA algorithm produces a 160-bit hash. In other embodiments, the hash function can be other suitable algorithms.

In the exemplary embodiment, the previous compressed fault map is generated using parametric values obtained from the magnetic memory cells 14 the first time that the control system 32 obtains the parametric values from the magnetic memory cells 14. In one embodiment, this occurs when magnetic memory 10 is manufactured. In one embodiment, this occurs when magnetic memory 10 is initially used in an application. In the exemplary embodiment, the previous compressed fault map used for the comparison is a compressed fault map generated from parametric values obtained at any suitable time from magnetic memory cells 14. In one embodiment, the previous compressed fault map is the same for each comparison and can be termed a baseline or initial compressed fault map. In one embodiment, the previous compressed fault map is generated at suitable times using parametric values obtained at suitable times from magnetic memory cells 14. In various embodiments, the previous compressed fault map could be generated at regular intervals, or could be generated in response to any suitable event external to array 12 or magnetic memory 10, or to any suitable changes in operating conditions of array 12 or magnetic memory 10.

In various embodiments, the faults or failure mechanisms affecting magnetic memory 10 can be any failure mechanism. In the exemplary embodiment, four failure mechanisms are identified. A shorted bit can occur when the resistance of a magnetic memory cell 14 is lower than expected. Shorted bits tend to affect all storage cells 14 lying in the same row and the same column. An open bit can occur when the resistance of a magnetic memory cell 14 is higher than expected. The open bit failures can sometimes affect all storage cells lying in the same row line 16, the same column line 18, or both. A half-select bit can occur when writing to a magnetic memory cell 14 located along a particular row line 16 or column line 18, and other magnetic memory cells 14 located along the same row line 16 or column line 18 change their stored logic state. A single failed bit can occur when a particular magnetic memory cell 14 fails. Single failed bits can include stuck-at faults, such as when the magnetic memory cell 14 is always stuck at a logic value of "0" or at a logic value of "1". Single failed bits do not affect or are not affected by read or write operations on other magnetic memory cells 14.

Figure 2A:
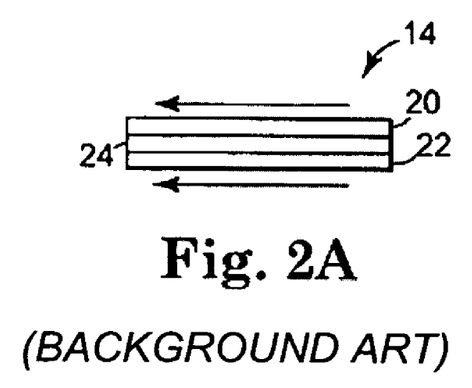
FIGS. 2A and 2B are diagrams illustrating parallel and anti-parallel magnetization of a magnetic memory cell.
Figure 2B:
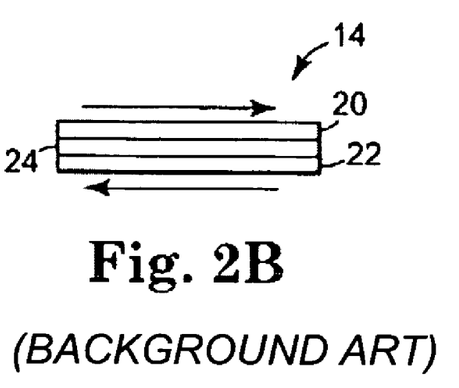

FIGS. 2A and 2B are diagrams illustrating parallel and anti-parallel magnetization of a magnetic memory cell. In one embodiment, magnetic memory cell 14 is a spin dependent tunneling device. Magnetic memory cell 14 includes a magnetic layer referred to as data storage layer 20, a magnetic layer referred to as reference layer 22, and a tunnel barrier 24 disposed between data storage layer 20 and reference layer 22. Data storage layer 20 is referred to as a free layer because it has a magnetization orientation that is not pinned and which can be oriented in either of two directions along an easy axis, which lies in a plane. Reference layer 22 is referred to as a pinned layer because it has a magnetization that is oriented in a plane but is fixed so as not to rotate in the presence of an applied magnetic field within a range of interest. The magnetization orientation assumes one of two stable orientations at any given time, which are the parallel and anti-parallel orientations.

FIG. 2A illustrates by arrows the parallel orientation when the magnetization of the free and pinned layers 20 and 22 are in the same direction along the easy axis. With parallel orientation, the orientation of magnetization in the data storage layer 20 is substantially parallel to the magnetization in the reference layer 22 along the easy axis, and magnetic memory cell 14 is in a low resistance state which can be represented by the value R. FIG. 2B illustrates by arrows the anti-parallel orientation when the magnetization of the free and pinned layers 20 and 22 are in opposite directions. With anti-parallel orientation, the orientation of magnetization in the data storage layer 20 is substantially anti-parallel to the magnetization in the reference layer 22 along the easy axis, and magnetic memory cell 14 is in a high resistance state which can be represented by the value R+ΔR. The insulating tunnel barrier 24 allows quantum mechanical tunneling to occur between the free and pinned layers 20 and 22. Because the tunneling is electron spin dependent, the resistance of magnetic memory cell 14 is a function of the relative orientations of the magnetization of the free and pinned layers 20 and 22.

Data is stored in magnetic memory cell 14 by orienting the magnetization along the easy axis of free layer 20. In one embodiment, a logic value of "0" is stored in magnetic memory cell 14 by orienting the magnetization of free layer 20 such that the magnetization orientation is parallel, and a logic value of "1" is stored in magnetic memory cell 14 by orienting the magnetization of free layer 20 such that the magnetization orientation is not parallel. In another embodiment, a logic value of "1" is stored in magnetic memory cell 14 by orienting the magnetization of free layer 20 such that the magnetization orientation is parallel, and a logic value of "0" is stored in magnetic memory cell 14 by orienting the magnetization of free layer 20 such that the magnetization orientation is not parallel.

Figure 3:
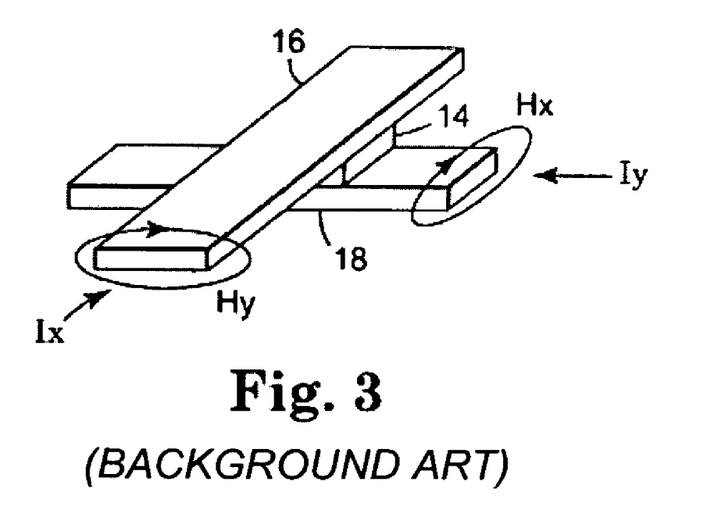
FIG. 3 is a diagram illustrating a magnetic memory cell that has been selected.

FIG. 3 is a diagram illustrating a magnetic memory cell 14 that has been selected. In one embodiment, the magnetization in free layer 20 of selected magnetic memory cell 14 is oriented by supplying the currents Ix and Iy to conductors 16 and 18, which cross the selected magnetic memory cell 14. Supplying the current Ix to word line 16 causes a magnetic field Hy to form around conductor 16. Supplying the current Iy to bit line 18 causes a magnetic field Hx to form around bit line 18. When sufficiently large currents Ix and Iy are passed through word line 16 and bit line 18, the magnetic fields Hx and Hy in the vicinity of free layer 20 cause the magnetization of free layer 20 to rotate from the parallel orientation to the anti-parallel orientation, or to rotate from the anti-parallel orientation to the parallel orientation.

In one embodiment, a magnetic memory cell 14 is read by applying sense currents to word line 16 and bit line 18. Magnetic memory cell 14 will have either a resistance of R or a resistance of R+ΔR, depending on whether the orientation of magnetization of the free and pinned layers 20 and 22 are parallel or anti-parallel, as illustrated in FIGS. 2A and 2B.

Figure 4:
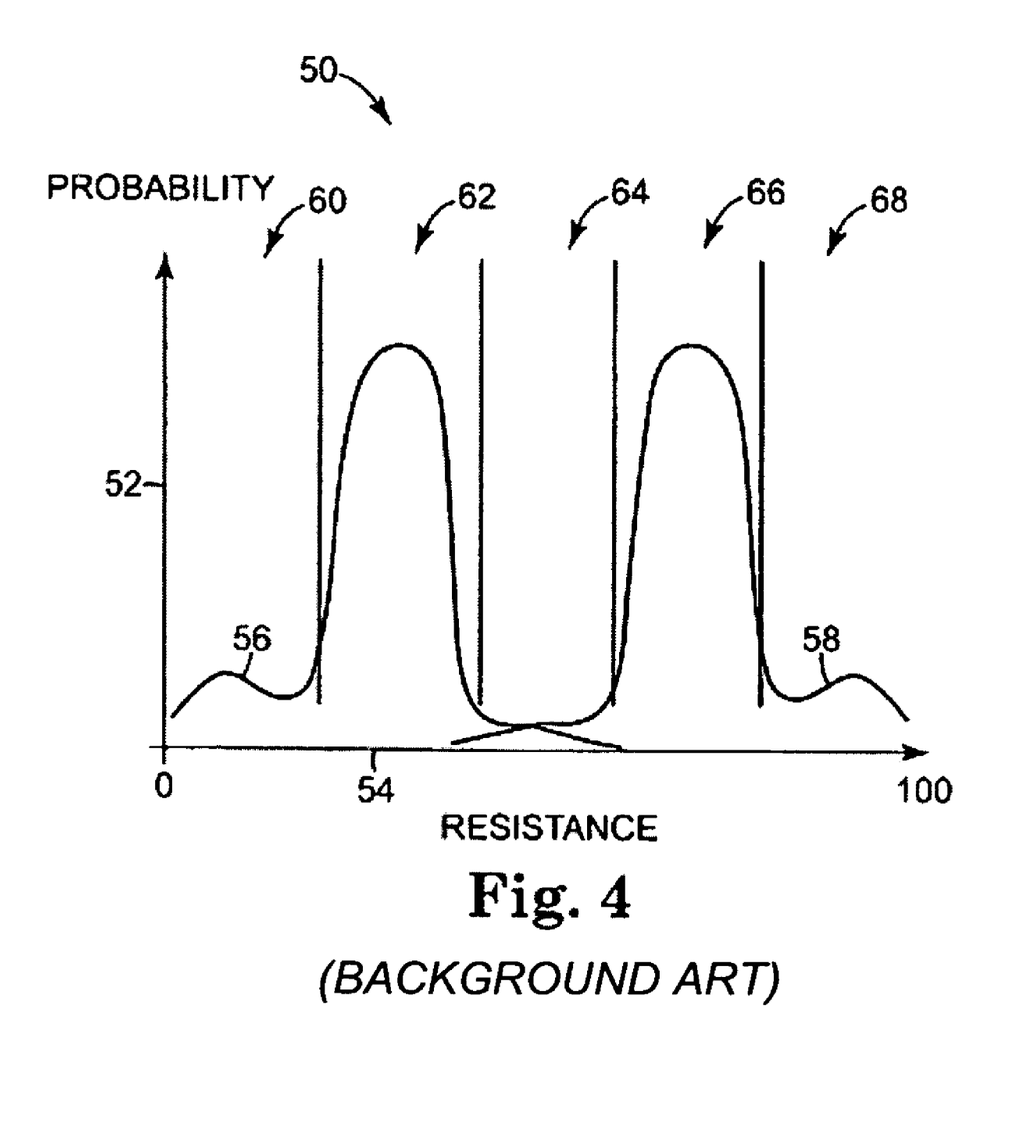
FIG. 4 is a graph illustrating an exemplary embodiment of parametric values obtained from a magnetic memory cell.

FIG. 4 is a graph 50 illustrating an exemplary embodiment of parametric values obtained from a magnetic memory cell 14. The parametric value illustrated in FIG. 4 is a resistance of the magnetic memory cell 14.

In other embodiments, the parametric values can be other suitable values which can be compared to expected ranges to determine if the corresponding magnetic memory cells 14 have faults. In one embodiment, the parametric value is a measure of time or a time value. In this embodiment, an integration approach can be used to measure the resistance of magnetic memory cell 14, where the time value indicates the logic state stored by magnetic memory cell 14. In one embodiment, the parametric value is an output voltage level at an output of magnetic memory 10 which provides a result of a read operation performed on a corresponding magnetic memory cell 14. In one example embodiment, the logic state of memory cell 14 is determined by comparing the voltage at the output to output voltage ranges which correspond to a logic "1" state and a logic "0" state. If an output voltage of magnetic memory 10 after a read operation on the corresponding magnetic memory cell 14 was expected to have a voltage level corresponding to a logic "1" state, and did not have the expected voltage level, or was expected to have a voltage level corresponding to a logic "0" state, and did not have the expected voltage level, the magnetic memory cell 14 would have a fault.

In one embodiment, the parametric value is a logic state of an output of the magnetic memory 10 which provides a result of a read operation performed on a corresponding magnetic memory cell 14. In one example embodiment, the output logic state is compared to an expected logic state. If an output logic state of magnetic memory 10 after a read operation on the corresponding magnetic memory cell 14 was expected to have a logic "1" state, and did not have the logic "1" state, or was expected to have a logic "0" state, and did not have the logic "0" state, the magnetic memory cell 14 would have a fault. In other embodiments, the parametric value can be any suitable value used to indicate the magnetic state stored by magnetic memory cell 14.

In the illustrated embodiment, the graph 50 illustrates a normalized probability at 52 versus resistance at 54 of an exemplary distribution of resistance values for magnetic memory cell 14. The low resistance state (R) of magnetic memory cell 14 is illustrated by the distribution at 56 and the high resistance state (R+ΔR) is illustrated by the distribution at 58. The distributions at 56 and 58 represent exemplary distributions of resistance values resulting from an exemplary manufacturing process used to fabricate magnetic memory cells 14. In one embodiment, the distributions can be affected by environmental factors such as temperature, by factors affecting a particular magnetic memory cell or cells 14 such as their location within array 12, or by defects which occur during the manufacturing process. In other embodiments, the distributions can be affected by other factors.

In the exemplary embodiment, the resistance at 54 has been divided into five ranges. In the first range at 60, the resistance of magnetic memory cell 14 is lower than the predicted range at 62 and represents a shorted-bit failure to a reasonable degree of certainty. In the second range at 62, the resistance of magnetic memory cell 14 for the resistance state R is within expected values, and is determined to be equivalent to the resistance state R. In the third range at 64, the resistance state of magnetic memory cell 14 cannot be ascertained to a reasonable degree of certainty. In the fourth range at 66, the resistance of magnetic memory cell 14 for the resistance state R+ΔR is within expected values, and is determined to be equivalent to the resistance state R+ΔR. In the fifth range at 68, the resistance of magnetic memory cell 14 for the resistance state R+ΔR is higher than the predicted range at 66 and represents an open-bit failure to a reasonable degree of certainty.

In other embodiments, the expected ranges for the resistance of magnetic memory cell 14 for the resistance states R and R+ΔR can have other distributions or values. In other embodiments, magnetic memory cell 14 can have more than two resistance states.

Figure 5:
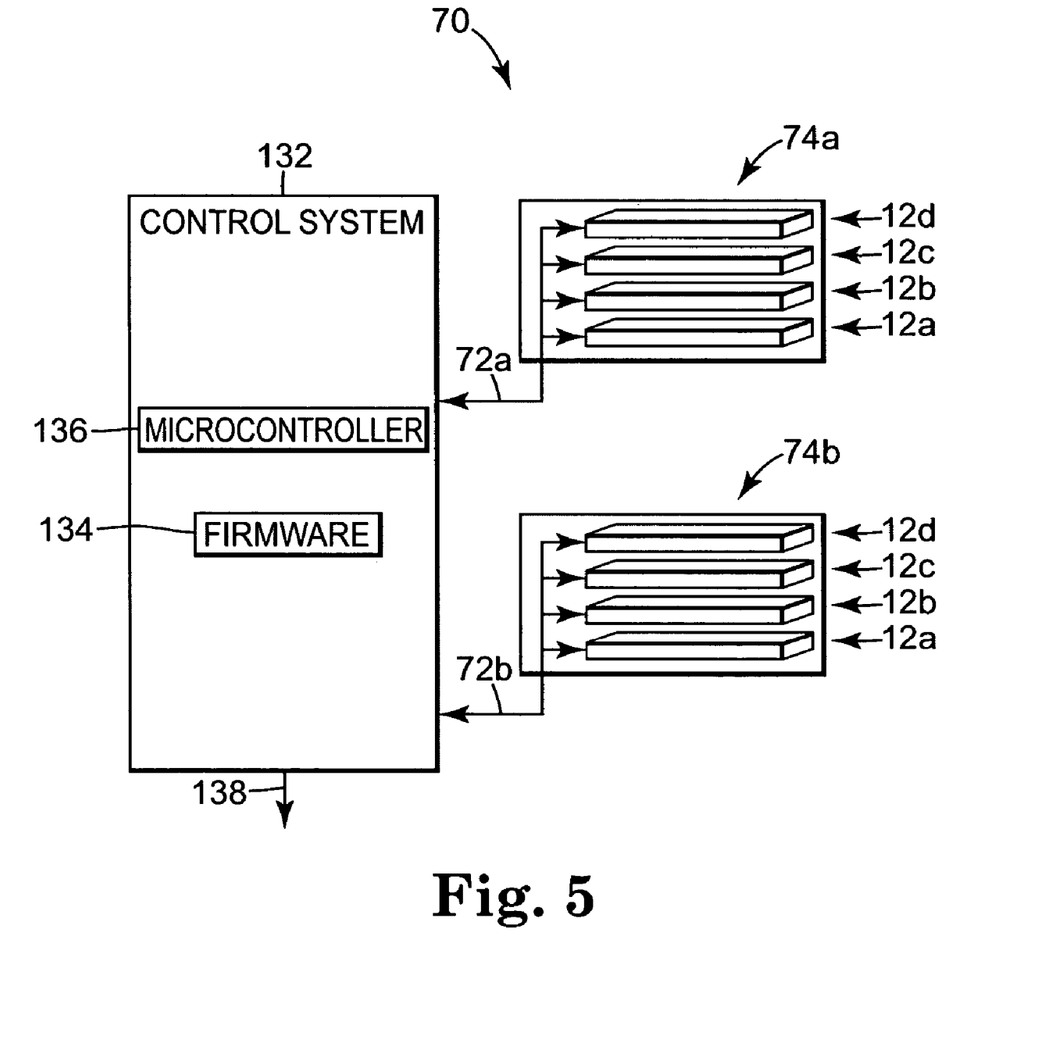
FIG. 5 is a diagram illustrating an exemplary embodiment of a storage system.

FIG. 5 is a diagram illustrating an exemplary embodiment of a storage system 70. In the exemplary embodiment, storage system 70 includes a control system 132. Control system 132 includes firmware 134 and microcontroller 136. The control system 132 illustrated in FIG. 5 is another embodiment of control system 32 illustrated in FIG. 1, and as such, the operation of control system 32 and 132 is also illustrated and described in FIG. 1. Control system 132 is configured to periodically obtain parametric values from magnetic memory cells 14 in the magnetic memory storage devices 74a and 74b and generate, using the parametric values, one or more compressed fault maps or error detection code results. The compressed fault maps or error detection code results are compared to one or more previous compressed fault maps or error detection code results, an indication is provided at 138 if there are differences.

Control system 132 is coupled via lines 72a and 72b to magnetic memory storage devices 74a and 74b. Each magnetic memory storage device 74a and 74b has four arrays 12a, 12b, 12c and 12d of magnetic memory cells 14. In other embodiments, each magnetic memory storage device 74a and 74b can include any suitable number of arrays 12. In other embodiments, each magnetic memory storage device 74a and 74b can include any suitable number of magnetic memories 10.

In the exemplary embodiment, the arrays 12 are independently addressable and are arranged to form a stack consisting of arrays 12a, 12b, 12c and 12d. Although only two memory storage devices 74a and 74b or stacks 74a and 74b of array 12 are illustrated, any suitable number of stacks 74a and 74b can be used.

In one exemplary embodiment, the memory storage devices 74a and 74b are arranged to form a 20 by 16 arrangement of stacks 74a and 74b, where each stack 74a and 74b includes four arrays 12. Each array 12 includes an array of 1024 by 1024 magnetic memory cells 14 or bits. In the exemplary embodiment, the storage system 70 has a storage capacity of 1,280 M bits. This storage capacity can be viewed as a logical sequence of 262, 144 sectors, where each sector contains 640 bytes. In one embodiment, within each sector, 512 bytes are available for storage of user data, and 128 bytes are reserved for error correction codes. In other embodiments, other arrangements of memory storage devices 74a and 74b can be used. In these other embodiments, each memory storage device 74a and 74b includes a suitable number of arrays 12.

FIG. 6 is a diagram illustrating an exemplary embodiment of an unsorted fault map 82, a sorted fault map 84 and a fault map signature 86. The fault maps 82 and 84 and the fault map signature 86 are illustrated at 80.

In the exemplary embodiment, the memory storage devices 74a and 74b are arranged to form a 20 by 16 arrangement of stacks 74a and 74b, where each stack 74a and 74b includes four arrays 12. Each array 12 includes an array of 1024 by 1024 magnetic memory cells 14 or bits.

In the exemplary embodiment, an uncompressed fault map which is an unsorted fault map 82 includes for each fault, a fault type and a fault location or address of the magnetic memory cell 14 having the fault. The fault type is represented as a two bit binary number designating either an open-bit failure, a shorted-bit failure, an indeterminate state failure (single failed bit) or a half-select failure. The fault location is represented as a 31 bit binary number which includes a stack 74a and 74b x coordinate (5 bits), a stack 74a and 74b y coordinate (4 bits), an array 12 location in the stack 74a and 74b (2 bits), an array 12 x-coordinate or column line 18 location (10 bits), and an array 12 y-coordinate or row line 16 location (10 bits). Each fault is represented by 33 bit binary number formed by concatenating the fault type (2 bits) with the location of the fault (31 bits). Because compressed fault maps are compared while uncompressed fault maps (e.g. the unsorted or sorted fault maps) are not compared, in other embodiments the number of bits used in the uncompressed fault maps can be any suitable number.

The unsorted fault map 82 has a first fault illustrated as "01 02 09 03 02 0c 00 de". This fault has a type of (01) which can be, for example, a shorted bit failure. The coordinates of stack 74a and 74b in the 20 by 16 arrangement is (x=2, y=9). The location of the layer or array 12 within the stack 74a and 74b is (3) which can be, for example, array 12c (see also, FIG. 5). This information is encoded into an 8 byte sequence as "01 02 09 03 02 0c 00 de" where 524 decimal equals 020c hex, and 222 decimal equals 00de hex. In other embodiments, the fault type is not included in the unsorted fault map.

In the exemplary embodiment, the fault types and the corresponding addresses of the magnetic memory cells 14 are sorted into a numerical order before the error detection code result is calculated. While an ascending numeral order is used in the exemplary embodiment, in other embodiments, other suitable orders can be used. The sorted fault map is illustrated at 84. To sort fault map 82 into fault map 84, a sort algorithm can be used. In various embodiments, the sort algorithm makes comparisons on a line by line basis, and swaps numbers where necessary. In the exemplary embodiment, the comparison is performed on a byte by byte basis.

In the exemplary embodiment, a fault signature illustrated at 86 is computed over the sorted fault map 84. The fault signature 86 is also termed a compressed fault map because it contains fewer characters than the sorted fault map 84. The fault signature 86 is calculated by treating the sorted fault map 84 as a stream of bytes. In the exemplary embodiment, the fault signature is calculated over the fault type and fault location. A cyclic redundancy check is used to calculate the fault signature. In the illustrated embodiment, the cyclic redundancy check is a CRC-32. In other embodiments, other suitable fault signature approaches can be used.

In the exemplary embodiment, one of the compressed fault maps or second compressed fault map is compared to a previous compressed fault map or first compressed fault map to determine if there are any differences between the fault maps. If there are differences, one or more of the faults have changed location or type. In one embodiment, the fault signatures or compressed fault maps are compared by comparing bits of the compressed fault map or second compressed fault map to bits of the previous compressed fault map or first compressed fault map. In the exemplary embodiment, the indication is provided at 38/138 if there are differences.

Figure 7:
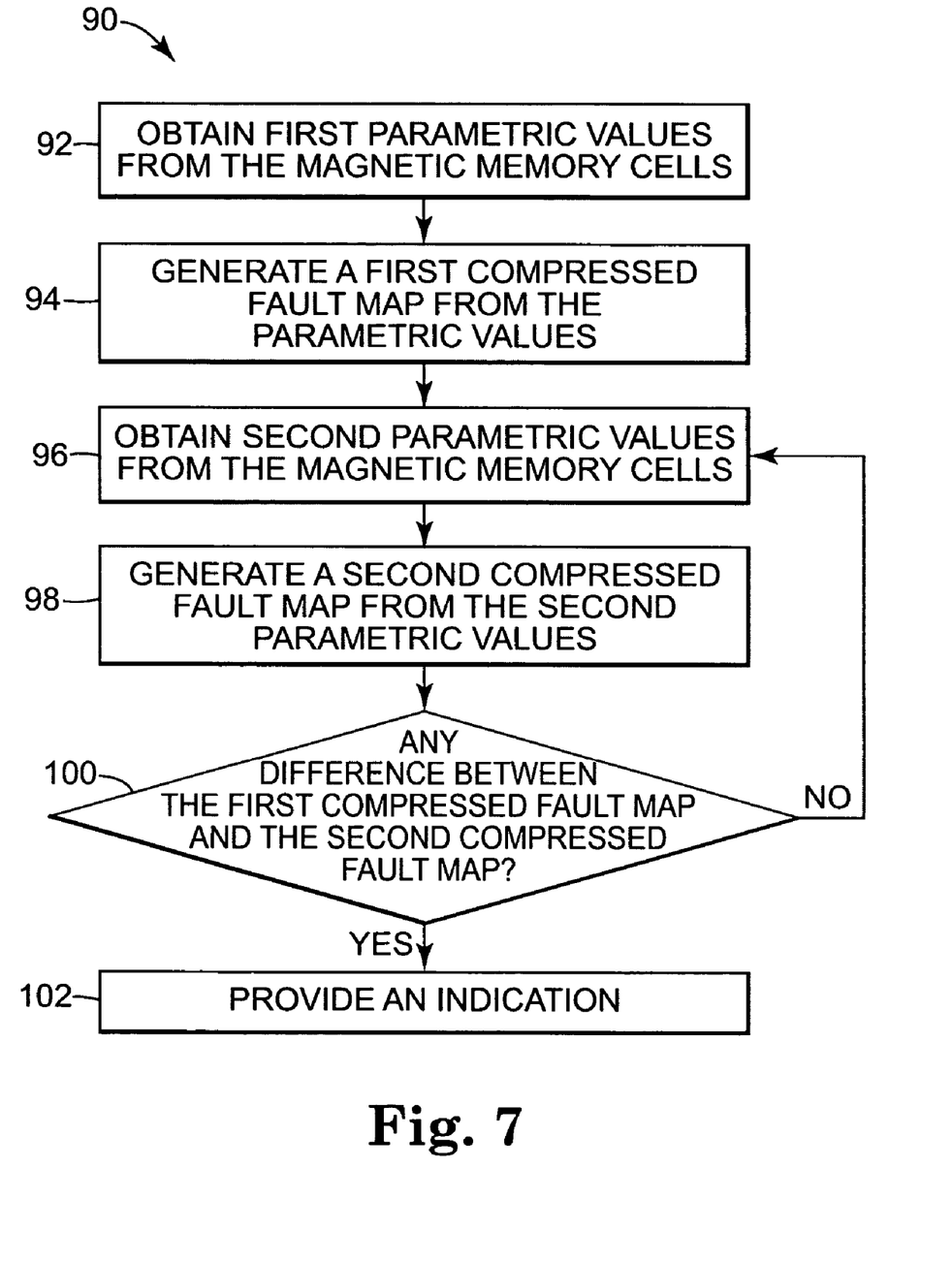
FIG. 7 is a flowchart illustrating an exemplary embodiment of a method of detecting magnetic memory degradation by comparing compressed fault maps.

FIG. 7 is a flowchart illustrating an exemplary embodiment of a method of detecting magnetic memory degradation by comparing compressed fault maps. The flowchart is illustrated at 90. The method at 92 obtains first parametric values from magnetic memory cells 14. The method at 94 generates a first compressed fault map from the parametric values. The method at 96 obtains second parametric values from the magnetic memory cells 14. The method at 98 generates a second compressed fault map from the second parametric values. The method at 100 determines if there are any differences between the first compressed fault map and the second compressed fault map. If the method at 100 determines that there are not any differences between the first compressed fault map and the second compressed fault map, the method at 96 obtains second parametric values from the magnetic memory cells 14. If the method at 100 determines that there are differences between the first compressed fault map and the second compressed fault map, the method at 102 provides an indication.

In one embodiment, the method at 100 includes a time interval delay before the method at 96 obtains second parametric values from the magnetic memory cells 14. In this embodiment, each time the method at 100 determines that there are not any differences between the first compressed fault map and the second compressed fault map, at 96 second parametric values are obtained from the magnetic memory cells 14 on a periodic basis after the time interval delay. In various embodiments, any suitable time interval delay can be used. In other embodiments, any suitable event can be used to initiate and/or end the time interval delay.

Another exemplary method periodically obtains parametric values from the magnetic memory cells 14 and generates a compressed fault map each time the parametric values are obtained. This method compares at least one of the compressed fault maps to a previous one of the compressed fault maps, and provides an indication if there are differences. In various embodiments, the previous compressed fault map can be generated more than once to compare to the later generated compressed fault map. This provides an approach to update the previous compressed fault map as desired. In one embodiment, the previous compressed fault map is stored temporarily in magnetic memory cells 14, and is updated on a suitable basis. In this embodiment, a comparison of both of the previous compressed fault maps is made to ensure they are equal.

In one embodiment, generating the compressed fault maps comprises calculating at least one error detection code result over the addresses of the magnetic memory cells 14 which have a fault. Each one of the magnetic memory cells 14 has a corresponding one of at least two addresses. The magnetic memory cells 14 have the fault when a corresponding one of the parametric values is not within an expected range.

In one embodiment, generating the compressed fault maps comprises calculating each one of at least two error detection code results. The error detection code results are calculated for a corresponding one of at least two address ranges, over the addresses of the magnetic memory cells 14 which have the fault and are within a same one of the address ranges. Each one of the addresses is within only one of the address ranges.

In one embodiment, generating the compressed fault maps comprises calculating at least one error detection code result over fault types and corresponding addresses of the magnetic memory cells 14 which have a fault. Each one of the magnetic memory cells 14 has a corresponding one of at least two addresses. The corresponding one of the parametric values is compared to the expected range to infer a corresponding one of the fault types.

In one embodiment, generating the compressed fault maps comprises calculating each one of at least two error detection code results over one of the fault types and the corresponding addresses of all of the magnetic memory cells 14 which have a same one of the fault types.

In one embodiment, generating the compressed fault maps comprises calculating each one of at least two error detection code results, for a corresponding one of at least two address ranges, over the fault types and the corresponding addresses of the magnetic memory cells 14 which have the fault and are within a same one of the address ranges. Each one of the addresses is within only one of the address ranges.

In one embodiment, generating the compressed fault maps comprises transferring the data from the magnetic memory cells 14 in at least one of the address ranges where at least one of the magnetic memory cells 14 has the fault, to the magnetic memory cells 14 in at least one of the address ranges where none of the magnetic memory cells 14 have the fault.

In one embodiment, generating the compressed fault maps includes sorting the fault types and the corresponding addresses of the magnetic memory cells 14 into a numerical order before the compressed fault maps are generated. In one embodiment, the numerical order is an ascending numerical order.

What is claimed is:

1. A magnetic memory, comprising:
   at least two magnetic memory cells configured to store data; and
   a control system configured to at least twice obtain parametric values from the magnetic memory cells and generate a corresponding compressed fault map using the parametric values, wherein at least one of the compressed fault maps is compared to a previous one of the compressed fault maps and an indication is provided if there are differences, said control system further configured to preserve data in said at least two magnetic memory cells by migrating the data from said at least two magnetic memory cells to another memory medium in response to the indication.

2. The magnetic memory of claim 1, wherein each one of the compressed fault maps includes at least one error detection code result which is calculated over the addresses of the magnetic memory cells which have a fault, wherein each one of the magnetic memory cells has a corresponding one of at least two addresses, and wherein the one of the magnetic memory cells has the fault when a corresponding one of the parametric values is not within an expected range.

3. The magnetic memory of claim 2, wherein each one of the compressed fault maps includes at least two error detection code results, wherein each one of the error detection code results is calculated for a corresponding one of at least two address ranges, over the addresses of the magnetic memory cells which have the fault and are within a same one of the address ranges, wherein each one of the addresses is within only one of the address ranges.

4. The magnetic memory of claim 1, wherein each one of the compressed fault maps includes at least one error detection code result which is calculated over fault types and corresponding addresses of the magnetic memory cells which have a fault, wherein each one of the magnetic memory cells has a corresponding one of at least two addresses, wherein the one of the magnetic memory cells has the fault when a corresponding one of the parametric values is not within an expected range, and wherein the corresponding one of the parametric values is compared to the expected range to infer a corresponding one of the fault types.

5. The magnetic memory of claim 4, wherein each one of the compressed fault maps includes at least two error detection code results, wherein each one of the error detection code results is calculated over one of the fault types and the corresponding addresses of all of the magnetic memory cells which have a same one of the fault types.

6. The magnetic memory of claim 4, wherein each one of the compressed fault maps includes at least two error detection code results, wherein each one of the error detection code results is calculated for a corresponding one of at least two address ranges, over the fault types and the corresponding addresses of the magnetic memory cells which have the fault and are within a same one of the address ranges, wherein each one of the addresses is within only one of the address ranges.

7. The magnetic memory of claim 4, wherein the fault types and the corresponding addresses of the magnetic memory cells are sorted into a numerical order before the error detection code result is calculated.

8. The magnetic memory of claim 4, wherein the error detection code result is calculated using a cyclic redundancy check code.

9. The magnetic memory of claim 1, wherein the one of the compressed fault maps is compared to the previous one of the compressed fault maps by comparing bits of the one of the compressed fault maps to bits of the previous one of the compressed fault maps, wherein an indication is provided if there are differences.

10. The magnetic memory of claim 1, wherein the previous one of the compressed fault maps is generated using parametric values obtained from the magnetic memory cells the first time that the control system obtains the parametric values from the magnetic memory cells.

11. The magnetic memory of claim 1, wherein the previous compressed fault map is stored in at least one of the magnetic memory cells.

12. A controller for a magnetic memory which includes at least one array of magnetic memory cells configured to store data, comprising:
    firmware configured to store a procedure for obtaining parametric values from magnetic memory cells in the array of magnetic memory cells and generating a compressed fault map using the parametric values; and
    a microcontroller configured to execute the procedure a first time to generate a first compressed fault map, wherein the microcontroller executes the procedure at one or more time intervals after the first time and compares a second compressed fault map generated at each time interval to the first compressed fault map and provides an indication if there are differences between the second compressed fault map and the first compressed fault map, said microcontroller further configured to preserve data in the at least one array of magnetic memory cells by migrating the data from the at least one array of magnetic memory cells to another memory medium in response to the indication.

13. The controller of claim 12, wherein the first compressed fault map and the second compressed fault map each include at least one error detection code result which is calculated over the addresses of the magnetic memory cells in the array which have a fault, wherein each one of the magnetic memory cells has a corresponding one of at least two addresses, and wherein the one of the magnetic memory cells has the fault when a corresponding one of the parametric values is not within an expected range.

14. The controller of claim 13, wherein the first compressed fault map and the second compressed fault map each include at least two error detection code results, wherein each one of the error detection code results is calculated for a corresponding one of at least two address ranges, over the addresses of the magnetic memory cells which have the fault and are within a same one of the address ranges, wherein each one of the addresses is within only one of the address ranges.

15. The controller of claim 12, wherein the first compressed fault map and the second compressed fault map each include at least one error detection code result which is calculated over fault types and corresponding addresses of the magnetic memory cells in the array which have a fault, wherein each one of the magnetic memory cells has a corresponding one of at least two addresses, wherein the one of the magnetic memory cells has the fault when a corresponding one of the parametric values is not within an expected range, and wherein the corresponding one of the parametric values is compared to the expected range to infer a corresponding one of the fault types.

16. The controller of claim 15, wherein the first compressed fault map and the second compressed fault map each include at least two error detection code results, wherein each one of the error detection code results is calculated over one of the fault types and the corresponding addresses of all of the magnetic memory cells in the array which have a same one of the fault types.

17. The controller of claim 15, wherein the first compressed fault map and the second compressed fault map each include at least two error detection code results, wherein each one of the error detection code results is calculated for a corresponding one of at least two address ranges, over the fault types and the corresponding addresses of the magnetic memory cells which have the fault and are within a same one of the address ranges, wherein each one of the addresses is within only one of the address ranges.

18. The controller of claim 17, wherein the microcontroller controls migration of data by transferring, when the indication is provided, the data from the magnetic memory cells in at least one of the address ranges where at least one of the magnetic memory cells has the fault, to the magnetic memory cells in at least one of the address ranges where none of the magnetic memory cells have the fault.

19. A storage system, comprising:
    at least two magnetic memory storage devices, each including at least one array of magnetic memory cells configured to store data; and
    a control system configured to periodically obtain parametric values from magnetic memory cells in the magnetic memory storage devices and generate, using the parametric values, at least one error detection code result which is compared to a previous at least one error detection code result, wherein an indication is provided if there are differences, said control system further configured to preserve data in said at least two magnetic memory storage devices by migrating the data from said at least two magnetic memory storage devices to another memory medium in response to the indication.

20. The storage system of claim 19, wherein the error detection code result is calculated over the addresses of the magnetic memory cells which have a fault, wherein each one of the magnetic memory cells has a corresponding one of at least two addresses, and wherein the one of the magnetic memory cells has the fault when a corresponding one of the parametric values is not within an expected range, and wherein the control system migrates data by transferring, when the indication is provided, the data from at least one of the magnetic memory storage devices wherein at least one of the magnetic memory cells has fault, to at least one of the magnetic memory storage devices where none of the magnetic memory cells have the fault.

21. The storage system of claim 20, wherein the error detection code result includes at least two error detection code results, wherein each one of the error detection code results is calculated for a corresponding one of at least two address ranges, over the addresses of the magnetic memory cells which have the fault and are within a same one of the address ranges, wherein each one of the addresses is within only one of the address ranges, and wherein the control system migrates data by transferring, when the indication is provided, the data from at least one of the address ranges wherein at least one of the magnetic memory cells has fault, to at least one of the address ranges where none of the magnetic memory cells have the fault.

22. The storage system of claim 19, wherein the error detection code result is calculated over fault types and corresponding addresses of the magnetic memory cells which have a fault, wherein each one of the magnetic memory cells has a corresponding one of at least two addresses, wherein the one of the magnetic memory cells has the fault when a corresponding one of the parametric values is not within an expected range, wherein the corresponding one of the parametric values is compared to the expected range to infer a corresponding one of the fault types, and wherein the control system migrates data by transferring, when the indication is provided, the data from at least one of the magnetic memory storage devices wherein at least one of the magnetic memory cells has fault, to at least one of the magnetic memory storage devices where none of the magnetic memory cells have the fault.

23. The storage system of claim 22, wherein the error detection code result includes at least two error detection code results, wherein each one of the error detection code results is calculated over one of the fault types and the corresponding addresses of all of the magnetic memory cells which have a same one of the fault types, and wherein the control system migrates data by transferring, when the indication is provided, the data from at least one of the magnetic memory storage devices wherein at least one of the magnetic memory cells has the fault, to at least one of the magnetic memory storage devices where none of the magnetic memory cells have the fault.

24. The storage system of claim 22, wherein each one of the error detection code results is calculated for a corresponding one of at least two address ranges, over the fault types and the corresponding addresses of the magnetic memory cells which have the fault and are within a same one of the address ranges, wherein each one of the addresses is within only one of the address ranges, and wherein the control system migrates data by transferring, when the indication is provided, the data from at least one of the address ranges wherein at least one of the magnetic memory cells has fault, to at least one of the address ranges where none of the magnetic memory cells have the fault.

25. A magnetic memory, comprising:
   at least two magnetic memory cells configured to store data; and
   control means for obtaining parametric values from the magnetic memory cells and generate a corresponding compressed fault map using the parametric values, wherein at least one of the compressed fault maps is compared to a previous one of the compressed fault maps and an indication is provided if there are differences, said control means further configured to preserve data in said at least two magnetic memory cells by migrating the data from said at least two magnetic memory cells to another memory medium in response to the indication.

26. The magnetic memory of claim 25, wherein the control means includes:
   first means for storing a procedure for obtaining parametric values from the magnetic memory cells and generating the corresponding compressed fault map using the parametric values; and
   second means for periodically executing the procedure and generating the corresponding compressed fault map, wherein the second means compares the compressed fault map to a previous one of the compressed fault maps and provides the indication if there are differences.

27. A method of detecting degradation in at least two magnetic memory cells, comprising:
   periodically obtaining parametric values from the magnetic memory cells;
   generating a compressed fault map each time the parametric values are obtained;
   comparing at least one of the compressed fault maps to a previous one of the compressed fault maps;
   providing an indication if there are differences; and
   preserving data in said at least two magnetic memory cells by migrating the data from said at least two magnetic memory cells to another memory medium in response to the indication.

28. The method of claim 27, wherein generating a compressed fault map comprises calculating at least one error detection code result over the addresses of the magnetic memory cells which have a fault, wherein each one of the magnetic memory cells has a corresponding one of at least two addresses, and wherein the one of the magnetic memory cells has the fault when a corresponding one of the parametric values is not within an expected range.

29. The method of claim 28, wherein generating a compressed fault map comprises calculating each one of at least two error detection code results, for a corresponding one of at least two address ranges, over the addresses of the magnetic memory cells which have the fault and are within a same one of the address ranges, wherein each one of the addresses is within only one of the address ranges.

30. The method of claim 27, wherein generating a compressed fault map comprises calculating at least one error detection code result over fault types and corresponding addresses of the magnetic memory cells which have a fault, wherein each one of the magnetic memory cells has a corresponding one of at least two addresses, wherein the one of the magnetic memory cells has the fault when a corresponding one of the parametric values is not within an expected range, and wherein the corresponding one of the parametric values is compared to the expected range to infer a corresponding one of the fault types.

31. The method of claim 30, wherein generating a compressed fault map comprises calculating each one of at least two error detection code results over one of the fault types and the corresponding addresses of all of the magnetic memory cells which have a same one of the fault types.

32. The method of claim 30, wherein generating a compressed fault map comprises calculating each one of at least two error detection code results, for a corresponding one of at least two address ranges, over the fault types and the corresponding addresses of the magnetic memory cells which have the fault and are within a same one of the address ranges, wherein each one of the addresses is within only one of the address ranges.

33. The method of claim 32, wherein migrating data from said at least two magnetic memory cells to another memory medium in response to the indication comprises transferring the data from the magnetic memory cells in at least one of the address ranges where at least one of the magnetic memory cells has the fault, to the magnetic memory cells in at least one of the address ranges where none of the magnetic memory cells have the fault.

34. A method of detecting degradation in a magnetic memory which includes at least one array of magnetic memory cells configured to store data, comprising:
   executing a procedure for obtaining parametric values from magnetic memory cells in the array of magnetic memory cells;
   generating a first compressed fault map from the parametric values; and
   for each one of at least one time intervals:
      executing the procedure to generate a second compressed fault map;
      comparing the second compressed fault map to the first compressed fault map;
      providing an indication if there are differences between the second compressed fault map and the first compressed fault map; and preserving data in said at least two magnetic memory storage devices by migrating data from said at least two magnetic memory storage devices to another memory medium in response to the indication.

35. The method of claim 34, wherein generating the first compressed fault map or generating a second compressed fault map includes sorting the fault types and the corresponding addresses of the magnetic memory cells into a numerical order before the first compressed fault map or the second compressed fault map is generated.

* * * * *